Figure 1:
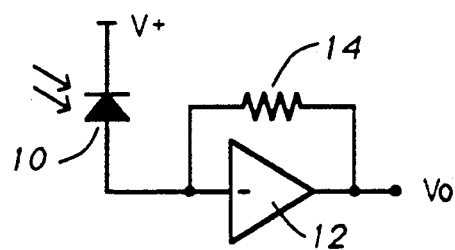

United States Patent [19]

Kahn

[11] Patent Number: 5,023,951
[45] Date of Patent: Jun. 11, 1991

[54] OPTICAL RECEIVERS

[75] Inventor: David A. Kahn, Nepean, Canada

[73] Assignee: Northern Telecom Limited, Montreal, Canada

[21] Appl. No.: 337,810

[22] Filed: Apr. 14, 1989

[51] Int. Cl.$^5$ .......................... G02F 1/00; H01S 3/00
[52] U.S. Cl. .................................. 455/619; 455/600; 455/608; 455/617; 330/59
[58] Field of Search ............... 455/619, 600, 606, 608, 455/617; 330/59

[56] References Cited

U.S. PATENT DOCUMENTS

| 4,473,745 | 9/1984 | Chown | 455/619 |
| 4,498,197 | 2/1985 | Chown | 455/619 |
| 4,574,249 | 3/1986 | Williams | 455/619 |
| 4,743,856 | 5/1988 | Keating | 328/111 |
| 4,744,105 | 5/1988 | Kasper | 455/619 |

FOREIGN PATENT DOCUMENTS

| 3320801 | 12/1983 | Fed. Rep. of Germany . | |
| 3223218 | 2/1984 | Fed. Rep. of Germany . | |
| 0168343 | 10/1983 | Japan | 455/619 |
| 1503088 | 3/1978 | United Kingdom . | |
| 2194406 | 3/1988 | United Kingdom | 455/619 |

OTHER PUBLICATIONS

"Technical and Operational Aspects of the Elie Fibre Optic Field Trial, The First to Offer Fully Integrated Loop Services", by D. A. Kahn, et al., IEEE Global Telecommunications Conference, Globecom '83, Nov. 28-Dec. 1, 1983, San Diego, Calif., U.S.A.
"Atlanta Fiber System Experiment: Optical Detector Package", by R. G. Smith et al., Bell System Technical Journal, vol. 57, No. 6, Jul.-Aug. 1978, pp. 1809-1822.
"Detectors-Inexpensive p-i-n Photodiodes Match Fiber, Source Characteristics", by P. H. Wentland et al., Electronics, Aug. 5, 1976, pp. 101-102.
Patent Abstracts of Japan, vol. 12, No. 187, (E-615)(3034) May 31, 1988, & JP-A-62 290205 (NEC Corp.) Dec. 17, 1987.
Patent Abstracts of Japan, vol. 11, No. 4, (E-478)(2488) Feb. 6, 1987 & JP-A-61 206303 (Toshiba Corp.), Sep. 12, 1986.
Electronics Letters, vol. 24, No. 17, Aug. 18, 1988, pp. 1061-1062; N. Ohkawa: "20 GHZ Bandwidth Low-Noise HEMT Preamplifier for Optical Receivers".
Telecommunications and Radio Engineering, vol. 41/42, No. 4, Apr. 1987, pp. 130-132, R. M. Shimov et al.: "A High-Sensitivity Photoamplifier".
Electron, vol. 31, No. 3, Mar. 1976, p. 138, K. H. J. Robers: "Licht Indicator".

Primary Examiner—Donnie L. Crosland
Attorney, Agent, or Firm—Dallas F. Smith; R. John Haley

[57] ABSTRACT

An optical receiver includes a reverse biassed photodiode whose output is coupled to a transimpedance amplifier. A load impedance for the photodiode comprises a forward biassed semiconductor diode, enabling the photodiode to be biassed using a low voltage supply. A signal compressing arrangement can be provided between the transimpedance amplifier output and the semiconductor diode on the side thereof remote from the photodiode. The transimpedance amplifier can have a capacitive transimpedance element; a filter, including an open circuit transmission line, is described which is coupled to the output of such an optical receiver to provide a desirable form of optical receiver arrangement. The capacitive transimpedance element can be constituted by a capacitance of the photodiode.

20 Claims, 3 Drawing Sheets

OPTICAL RECEIVERS

This invention relates to optical receivers, and is particularly concerned with an optical receiver including a photodiode and a transimpedance amplifier.

It is known from an article entitled "Atlanta Fiber System Experiment: Optical Detector Package" by R. G. Smith et al. in the Bell System Technical Journal, Vol. 57, No. 6, July-August 1978, pages 809 to 1822 to provide an optical receiver comprising an avalanche photodiode (APD) coupled to a transimpedance amplifier. The transimpedance amplifier is a shunt feedback amplifier which acts as a current-to-voltage transducer providing an output voltage determined by the photodiode current multiplied by the feedback resistance. It has the advantages of being less noisy for a given bandwidth than an unequalized amplifier which does not employ feedback, and having a larger dynamic range than, and not requiring individual adjustment as does, an equalized amplifier.

It is also known from an article entitled "Detectors—Inexpensive p-i-n photodiodes match fiber, source characteristics" by P. H. Wentland et al. in Electronics, Aug. 5, 1976, pages 101 and 102 to provide an optical receiver comprising a high performance p-i-n type silicon photodiode coupled to a transimpedance amplifier.

A problem with such known optical receivers is that the photodiode is reverse biassed via a load resistor which must have a relatively high resistance in order to minimize noise. This resistance, in conjunction with the reverse bias supply voltage, limits the upper level of photocurrent which can be accommodated, and hence limits the dynamic range of the optical receiver. There is thus a direct conflict between the desire for a high resistance to minimize noise and a low resistance to maximize dynamic range. Typically, a relatively high resistance has been used in conjunction with a relatively high voltage power supply to increase the upper limit of photodiode current. It would be desirable to eliminate the need for such a high voltage power supply, and to reverse bias the photodiode from the same power supply, typically having a low voltage of 5 volts, as is used for other parts of an optical receiver arrangement. In addition, it is desirable to use most of the supply voltage for reverse biassing the photodiode and thereby reducing its capacitance and improving its speed and noise characteristics.

An object of this invention, therefore, is to provide an improved optical receiver.

According to one aspect of this invention there is provided an optical receiver comprising a photodiode which is reverse biassed via a forward biassed semiconductor diode.

In such an optical receiver, the forward biassed semiconductor diode provides a desirable load impedance for the reverse biassed photodiode, without necessitating a large voltage drop at high photocurrent levels and without significantly affecting noise and dynamic range characteristics. The relatively low forward voltage drop across this semiconductor diode enables low supply voltage levels, of the order of 5 volts, to be used for biassing the combination of the photodiode and load impedance.

The optical receiver preferably includes a transimpedance amplifier having an input and an output, and coupling means coupling the input of the transimpedance amplifier to a junction between the photodiode and the semiconductor diode. The coupling means can comprise a capacitor, but desirably this junction is connected directly to the input of the transimpedance amplifier, which may include a.c. coupling internally between input and output stages thereof.

In an embodiment of the invention, the optical receiver includes signal compressing means, conveniently comprising two diodes connected in parallel with one another with opposite polarities, a.c. coupled between the output of the transimpedance amplifier and a terminal of the semiconductor diode remote from said junction.

In another embodiment of the invention, the transimpedance amplifier comprises an amplifier having an inverting input and an output coupled respectively to the input and the output of the transimpedance amplifier, and a capacitance coupled between the input and the output of the transimpedance amplifier.

In a development of this embodiment of the invention the photodiode is coupled between the input and the output of the amplifier, the capacitance comprising a capacitance of the photodiode. In this case the optical receiver may include a potential divider, constituting an attenuator, coupled to the output of the amplifier the photodiode being coupled to a tapping point of the potential divider and thereby to the output of the amplifier. The potential divider is conveniently a capacitive potential divider to avoid introducing noise, as would be the case using a resistive potential divider.

The invention also provides an optical receiver arrangement comprising such an optical receiver and a filter circuit coupled thereto, the filter circuit comprising a bipolar transistor having a base coupled to the output of the transimpedance amplifier, a collector for producing a filtered output signal, and an emitter; an open circuit transmission line having a characteristic impedance and a predetermined length; and an emitter impedance matched to the characteristic impedance coupling the transmission line to the emitter.

According to another aspect of this invention there is provided an optical receiver comprising: an amplifier having an inverting input and an output; a photodiode coupled between the output and the inverting input of the amplifier; a semiconductor diode coupled to the photodiode; and means for biassing the photodiode via the semiconductor diode whereby the photodiode is reverse biassed and the semiconductor diode is forward biassed.

According to a further aspect of this invention there is provided an optical receiver comprising: a transimpedance amplifier comprising an amplifier having an inverting input, an output, and a transimpedance element coupled therebetween; a photodiode and a load impedance therefor connected in series therewith, the load impedance comprising a semiconductor diode poled oppositely to the photodiode; means for biassing the photodiode via the semiconductor diode whereby the photodiode is reverse biassed and the semiconductor diode is forward biassed; and coupling means coupling a junction between the photodiode and the load impedance to said inverting input.

In an embodiment of this aspect of the invention, the transimpedance element comprises a capacitance, which may be constituted by a capacitance of the photodiode.

An optical receiver arrangement in accordance with another aspect of this invention comprises such an optical receiver and filtering means coupled to the output of said amplifier, the filtering means having a gain which increases with increasing frequency.

Preferably the filtering means comprises a bipolar transistor having a base coupled to the output of said amplifier, a collector from which an output signal is derived, and an emitter; an emitter impedance; and a transmission line having a predetermined length, one end of the transmission line being coupled via the emitter impedance to the emitter and the other end of the transmission line being an open circuit, the emitter impedance being matched to a characteristic impedance of the transmission line.

The invention also extends to an optical receiver comprising: a transimpedance amplifier comprising an amplifier having an inverting input, an output, and a capacitance coupled therebetween, said capacitance constituting a transimpedance element; a photodiode and a load impedance therefor connected in series therewith; means for reverse biassing the photodiode via the load impedance; and coupling means coupling a junction between the photodiode and the load impedance to said inverting input.

A further aspect of this invention provides a filter for an optical receiver arrangement, the filter comprising a bipolar transistor having a base coupled to the output of said amplifier, a collector from which an output signal is derived, and an emitter; an emitter impedance; and a transmission line having a predetermined length, one end of the transmission line being coupled via the emitter impedance to the emitter and the other end of the transmission line being an open circuit, the emitter impedance being matched to a characteristic impedance of the transmission line.

Figure 2:
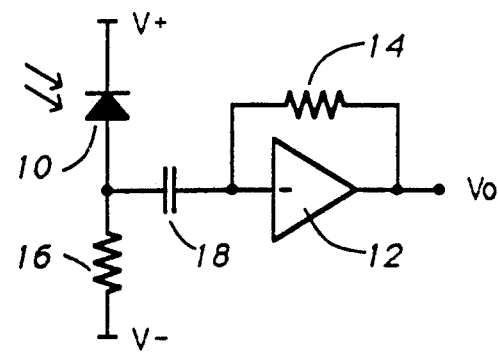
Figure 3:
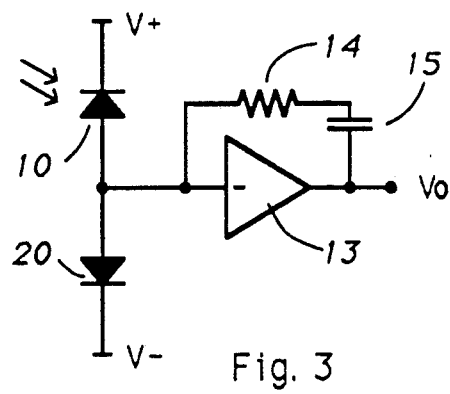
Figure 4:
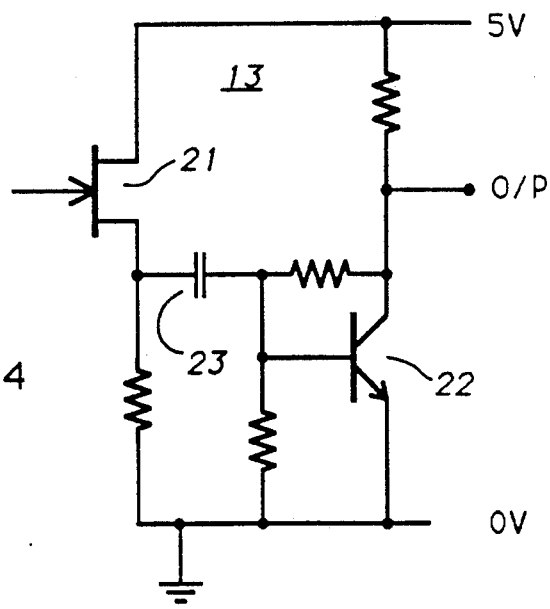
Figure 6:
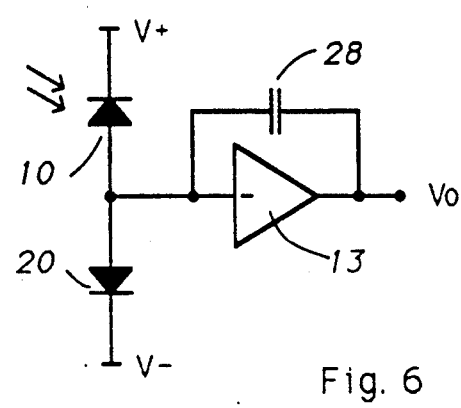
Figure 7:
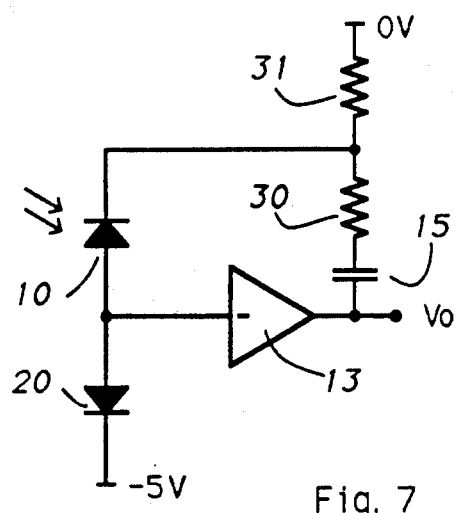
Figure 8:
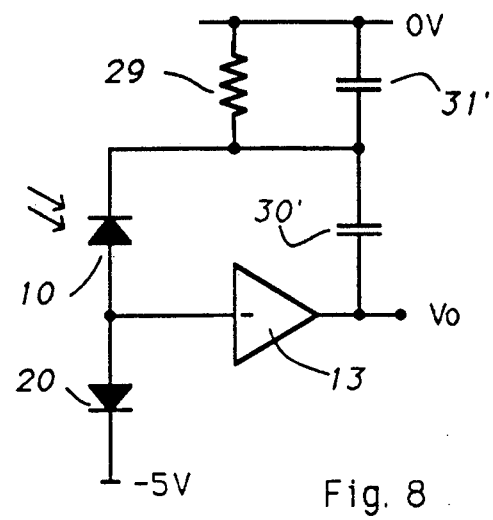
Figure 9:
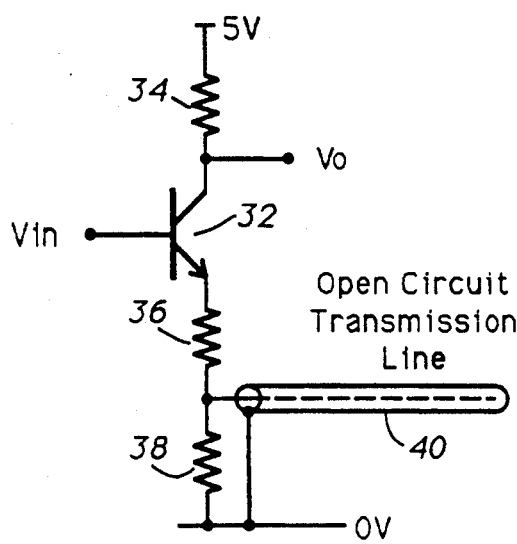
Figure 10:
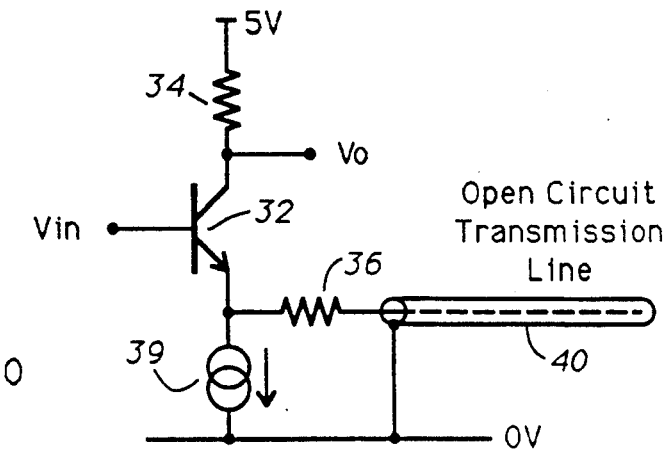
Figure 11:
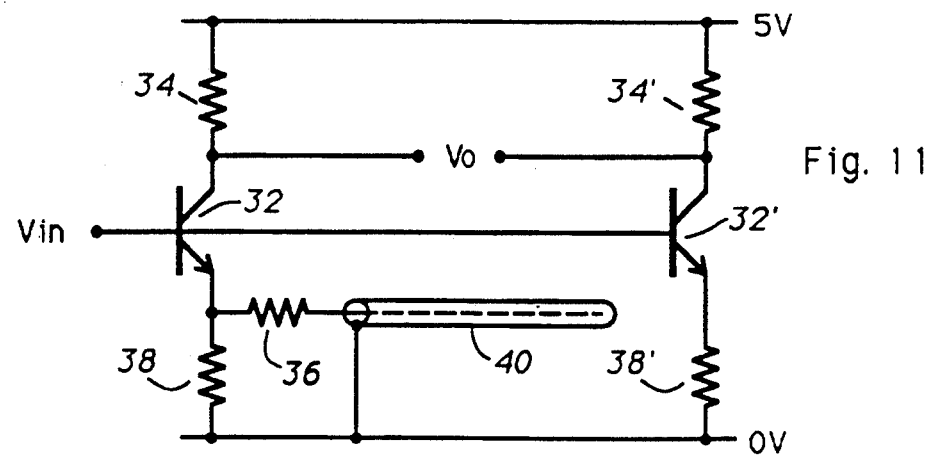
Figure 12:
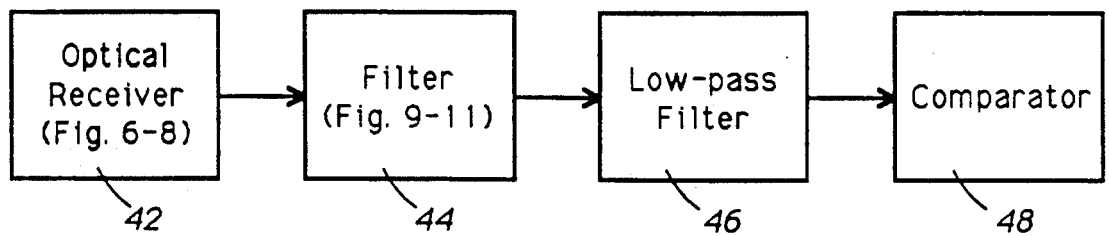
Figure 13:
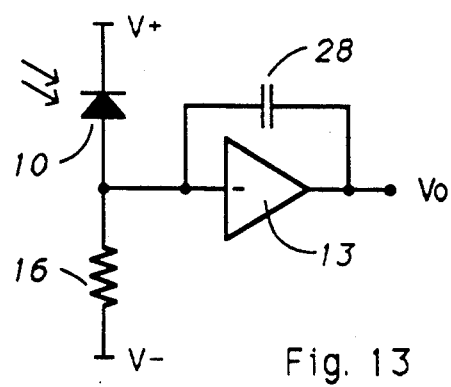

The invention will be further understood from the following description with reference to the accompanying drawings, in which similar references are used throughout the different figures to denote similar components, and in which:

FIGS. 1 and 2 schematically illustrate known optical receivers each including a photodiode and a transimpedance amplifier;

FIG. 3 schematically illustrates an optical receiver, including a photodiode and a transimpedance amplifier, in accordance with an embodiment of this invention;

FIG. 4 schematically illustrates a form of transimpedance amplifier which may be used in an optical receiver in accordance with this invention;

FIGS. 5 to 8 schematically illustrate optical receivers in accordance with other embodiments of this invention;

FIGS. 9 to 11 schematically illustrate alternative forms of a filter particularly suited for use in an optical receiver arrangement including the optical receiver of FIG. 6, 7, or 8;

FIG. 12 illustrates in a block diagram an optical receiver arrangement including the optical receiver of FIG. 6, 7, or 8 and the filter of FIG. 9, 10, or 11; and FIG. 13 schematically illustrates an optical receiver in accordance with yet another embodiment of this invention.

Referring to FIG. 1, there is illustrated a known form of optical receiver which comprises a photodiode 10 which is directly coupled to a transimpedance amplifier comprising an inverting amplifier 12 and a transimpedance resistor 14. The photodiode 10 is for example an avalanche photodiode or p-i-n type silicon photodiode which serves to receive a modulated light signal, as represented by arrows, for example from an optical fiber (not shown) of a communications system. In this direct-coupled optical receiver, the photodiode 10 is reverse biassed by a power supply voltage V+, and the transimpedance amplifier produces an output signal voltage Vo representing the modulation signal. The transimpedance resistor 14 has a relatively high resistance and serves as a load resistor for the photodiode 10.

FIG. 2 shows an a.c. coupled optical receiver which similarly includes a photodiode 10 and a transimpedance amplifier comprising an inverting amplifier 12 and a transimpedance resistor 14. In the optical receiver of FIG. 2, the photodiode 10 is coupled to a negative supply voltage V− via a resistor 16 which serves as a load resistor for the photodiode 10, and the junction between the photodiode 10 and its load resistor 16 is a.c. coupled to the input of the transimpedance amplifier by a coupling capacitor 18.

As discussed in the introduction above, in order to provide desirable noise characteristics the load resistor for the photodiode 10, namely the resistor 14 in the optical receiver of FIG. 1 and the resistor 16 in the optical receiver of FIG. 2, must have a high resistance. Consequently, one or both of the power supply voltages V+ and V− has a relatively large magnitude, of for example 15 volts or more. Accordingly, such supply voltages must be provided specifically for biassing the photodiode 10, even though much lower supply voltages, of for example 5 volts, are typically used for powering the amplifier 12 and subsequent digital circuitry which is provided for processing the output signal Vo of the optical receiver.

FIG. 3 illustrates an optical receiver in accordance with an embodiment of this invention which enables this disadvantage of the prior art to be avoided. In the optical receiver of FIG. 3, the photodiode 10 is directly coupled to the transimpedance amplifier comprising an a.c. coupled amplifier 13 and transimpedance resistor 14, the transimpedance resistor 14 being a.c. coupled to the output of the amplifier 13 via a coupling capacitor 15. In contrast to the prior art, in the optical receiver of FIG. 3 the photodiode 10 is reverse biassed via a forward biassed diode 20. The diode 20 desirably has a small junction area to minimize its capacitance, and maximize its impedance, particularly at low bias levels, and should have a low reverse leakage. For example, the diode 20 may be a silicon diode type IN914. Alternatively, and especially for high speed applications, the diode 20 may be a p-i-n type diode having a low capacitance, for example Hewlett Packard-Packard type 5082-3900.

The a.c. coupled amplifier 13 conveniently has a form such as that described below with reference to FIG. 4. A d.c. coupled amplifier, such as the amplifier 12 of the prior art, could be used in the optical receiver of FIG. 3 with a.c. coupling of the junction between the diodes 10 and 20 to the input of the transimpedance amplifier, for example via the capacitor 18. However, the direct coupling of FIG. 3 is preferred because it can be physically smaller than a.c. coupling. This is significant because the virtual-ground input of the transimpedance amplifier is very sensitive to electro-magnetic interference, and because any stray capacitance results in extra noise.

Referring to FIG. 4, the a.c. coupled amplifier 13 conveniently comprises an input field effect transistor 21, connected in common-drain or source-follower mode, and a bipolar transistor 22 connected in common-emitter mode, with a.c. coupling therebetween via a capacitor 23. Resistors connected between the collector-base and base-emitter electrodes of the transistor 22 have high resistances which are selected to bias the amplifier output at about mid-way between the 0V and 5V supply rails.

Referring again to FIG. 3, in the presence of an incoming modulated light signal, the photodiode 10 generates a photocurrent which flows through the diode 20, which acts as a load impedance for the photodiode 10. The diode 20 has a small signal resistance which is inversely proportional to the photocurrent, and the transimpedance amplifier is designed to have a much lower input impedance. Consequently, substantially all of the modulated signal current is coupled to the input of the transimpedance amplifier, and flows to the transimpedance resistor 14, rather than being lost in the load diode 20.

The load diode 20 contributes noise which is thermal noise associated with the diode's small signal resistance. For a silicon diode 20 such as that referred to above, having an ideality factor of about 2, the mean square current noise is approximately equal to the quantum shot noise associated with the photocurrent. Consequently, the noise increase due to the presence of the load diode 20 is relatively small, and the total noise present at the input of the transimpedance amplifier is typically insignificant in comparison to the thermal noise of the amplifier itself.

In contrast to the prior art, in the optical receiver of FIG. 3 the direct voltage which is dropped across the load impedance for the photodiode 10, namely the diode 20, is limited to about 0.7 volt even at the highest common photocurrent levels. In consequence, the potential difference between the supply voltages V+ and V− can be greatly reduced, to the order of 5 volts. This advantage is achieved without compromising the dynamic range or noise levels of the optical receiver.

As in the prior art, the photodiode 10 in the optical receiver of FIG. 3 may be an avalanche photodiode especially for high frequency modulating signals of the order of 600Mb/s or more, or may be a p-i-n type photodiode, especially for these or lower frequency modulating signals.

As is well known, the resistance of the transimpedance resistor 14 should be high in order to achieve a high gain and low noise. However, the supply voltage for the amplifier 13 must exceed, with some margin, the product of peak-to-peak photocurrent with the transimpedance resistance. For optimal results, typically the quiescent bias level of the output of the amplifier 13 is designed, as described above in relation to FIG. 4, to be close to the midpoint between the power supply voltages V+ and V−. As the signal level increases, it appears symmetrically about this bias level, the coupling being a.c.

With binary digital modulating signals, a linear amplifier characteristic is not essential, and signal compression is possible. It is known to achieve such signal compression by providing a pair of semiconductor diodes connected in parallel with one another and with opposing polarities, in parallel with the transimpedance resistor 14. However, the capacitance associated with such diodes causes a frequency and level-dependent distortion of the signal to a degree which may be unacceptable. In particular, where the transimpedance resistor has a high resistance, for example 1 MΩ, the capacitance of the diodes degrades the frequency response of the optical receiver at low signal levels.

Figure 5:
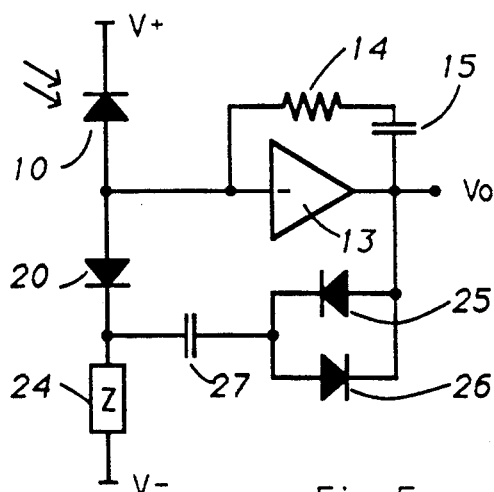

FIG. 5 illustrates an optical receiver which provides signal compression but which avoids this disadvantage. In the optical receiver of FIG. 5, an impedance 24, for example comprising a 1kΩ resistor and a 1nF capacitor in parallel with one another, is connected between the load diode 20 and the negative supply voltage V−. The relatively small resistance of the impedance 24 is such that the voltage drop across this resistor is much less than 1 volt even at the highest photocurrent levels. In this optical receiver, signal compression is provided by a pair of oppositely poled diodes 25 and 26, connected in parallel with one another, a.c. coupled via a capacitor 27 between the output of the amplifier 13 and the junction between the load diode 20 and the impedance 24.

At low signal levels, the signal compression diodes 25 and 26 are substantially capacitive, but they are isolated from the input node of the transimpedance amplifier by the load diode 20, which has a relatively high impedance at high signal levels. In addition, the impedance 24 forms with the signal compression diodes 25 and 26 a potential divider, which due to the low magnitude of the impedance 24 greatly attenuates the level of the output voltage Vo which is fed back towards the input of the transimpedance amplifier. Consequently, the optical receiver of FIG. 5 avoids the capacitive feedback problems of the known signal compression arrangements discussed above.

At high signal levels, at which the load diode 20 has a relatively low impedance, the output voltage Vo drives the diodes 25 and 26 into conduction at the instantaneous extreme signal levels, and current flows back into the virtual ground at the input node of the transimpedance amplifier via the diode 20. The optical receiver thus provides a considerable dynamic range. With a potential difference of 5 volts between the supply voltages V+ and V−, the compressed output signal level Vo is typically of the order of 0.5 volt peak-to-peak.

FIG. 6 illustrates a further form of optical receiver which is similar to that of FIG. 3, except that the transimpedance resistor 14 and coupling capacitor 15 are replaced by a capacitor 28. The capacitor 28 has a capacitance which is small in relation to the capacitance of the photodiode 10 and the input capacitance of the amplifier 13 in order not significantly to degrade the noise performance of the optical receiver, especially at high frequencies. Assuming that the amplifier 13 has a conventional single pole open loop characteristic, the input impedance of the transimpedance amplifier with the capacitive feedback provided by the capacitor 28 is resistive. As indicated above, this input impedance is designed to be much less than the small signal resistance of the load diode 20.

As the transimpedance amplifier in the optical receiver of FIG. 6 has only capacitive feedback, the feedback element generates no noise. The resistive noise contribution, which is typically dominant, of conventional transimpedance amplifiers having resistive feedback is thereby avoided, resulting in improved sensitivity of the optical receiver. In addition, a transimpedance amplifier having capacitive feedback as shown in FIG. 6 is relatively stable and can be relatively easily manufactured.

The capacitor 28 can typically have a capacitance which is less than 1pF, enabling the transimpedance amplifier to have a high gain. This gain is frequency dependent, rolling off linearly with increasing frequency. If a flat response is desired, the optical receiver output signal voltage Vo can be coupled via an equalization stage, such as a differentiator, having a frequency dependent gain. However, such an equalization stage is unnecessary in an optical receiver arrangement as described below with reference to FIG. 8 or 9.

Instead of providing the capacitor 28 as a transimpedance element, the capacitance of the photodiode 10 itself may be used by connecting the photodiode 10 in the feedback path of the amplifier 13. FIGS. 7 and 8 illustrate optical receivers in which this is done.

Referring to FIG. 7, the photodiode 10 reverse biassed from a −5 volt supply via the forward biassed diode 20, is a.c. coupled in the feedback path of the amplifier 13 by the coupling capacitor 15 and a potential divider constituted by resistors 30 and 31, the photodiode 10, resistor 30, and capacitor 15 being connected in series between the inverting input and the output of the amplifier 13, and the resistor 31 being connected between a zero volt supply line and the junction between the photodiode 10 and the resistor 30.

The capacitor 15 serves to block d.c., and has a capacitance which is very much greater than that of the photodiode 10. The potential divider attenuates the output of the amplifier 13 by a factor of for example about 5 determined by the ratio of the resistances of the resistors 30 and 31 (for example 500 and 100 ohms respectively), whereby the effective capacitance of the transimpedance circuit is equal to the capacitance of the photodiode 10 divided by this factor. The attenuator thus avoids too high an effective capacitance in the feedback path, and hence too low a gain of the transimpedance amplifier. With a low capacitance of the photodiode 10 it is conceivable that the attenuator (resistors 30 and 31) could be omitted.

In the optical receiver of FIG. 7, the resistors 30 and 31 introduce a noise component which is undesirable. This is avoided by the alternative arrangement of FIG. 8, in which the attenuator is formed by a capacitive potential divider comprising capacitors 30' and 31'. The capacitors 30' and 31' can have capacitances of for example 10pF and 50pF respectively, to provide the same attenuation factor of about 5 as in the optical receiver of FIG. 7. In view of this capacitive coupling, in the optical receiver of FIG. 8 the coupling capacitor 15 of FIG. 7 is not required, but a resistor 29 is provided in parallel with the capacitor 31' to provide a d.c. path for the photodiode 10. The resistor 29 is selected to have a resistance which is high compared with the impedance of the capacitor 31' which shunts it, whereby its noise contribution is also shunted and thereby reduced, but which is not so high that it overly restricts the dynamic range of the optical receiver.

The same comments, regarding the frequency dependence of gain, apply to the optical receivers of FIGS. 7 and 8 as to the optical receiver of FIG. 6, because these optical receivers also have a capacitive transimpedance element.

In an optical receiver arrangement, the output signal from an optical receiver is typically coupled via a filter which is designed to maximize the "eye" opening while minimizing noise by restricting bandwidth. Such a filter desirably is a matched filter having a sinc ((sine x)/x) response, augmented by a low-pass filter for removing noise from second and subsequent lobes of the sinc filter. FIG. 9 illustrates a sine filter which is particularly suited for such purposes when used with the optical receiver of FIG. 6, 7, or 8.

Referring to FIG. 9, the filter illustrated therein comprises an NPN bipolar transistor 32, having a base for receiving an input voltage Vin, a collector for supplying an output signal voltage Vout, coupled to a positive supply voltage of 5 volts via a collector resistor 34, and an emitter coupled via resistors 36 and 38 to a zero voltage supply rail. In addition, the filter comprises an open circuit transmission line 40, one end of which is coupled across the resistor 38. The transmission line 40 may comprise a coaxial cable, stripline, or any other form of transmission line suitable for providing a delay as described below. The resistor 36 couples the emitter of the transistor 32 to the transmission line 40 in a matched manner. To this end the resistance of the resistor 36, plus the output impedance at the emitter of the transistor 32, in parallel with the typically much greater resistance of the resistor 38, is selected to equal the characteristic impedance of the transmission line 40, for example 50 ohms. For example, the output impedance of the transistor 32 may be of the order of 10 ohms, and the resistors 36 and 38 may have resistances of the order of 40 ohms and 1000 ohms respectively. The resistor 34 may conveniently have a resistance of the order of 50 ohms.

The transmission line 40 is selected to have a length which is such that the signal propagation delay along the transmission line from its connected end to its open circuit end is equal to half the bit period T of a binary digital signal to be filtered, whereby the round-trip transmission delay along the line 40 and back is equal to the bit period T. For a signal with a bit rate of 600 Megabits per second the length of the transmission line 40 would be typically about 17 centimeters. A signal appearing in the emitter circuit of the transistor 32 is reflected by the open circuit end of the transmission line 40, whereby the filter provides a sine ($\omega T/2$) response.

FIG. 10 illustrates an alternative form of sine filter, which is similar to that of FIG. 9 except that the resistor 38 is dispensed with, and a constant current circuit 39 is connected between the emitter of the transistor 32 and the zero volt supply line. Again in this case, the resistor 36 provides a matched coupling of the emitter of the transistor 32 to the line 40.

FIG. 11 illustrates a further alternative form of sine filter which is at present preferred. The filter of FIG. 11 substitutes the resistor 38 for the constant current source 39 of the filter of FIG. 10, and provides a differential output voltage Vo taken from the collector of the transistor 32 with respect to the collector of another transistor 32', whose base is supplied with the input signal Vin and which has collector and emitter resistors 34' and 38', but no transmission line associated therewith. The differential output and the components 32', 34', and 38' serve to eliminate from the output voltage Vo effects arising from the resistor 38 and any capacitance at the emitters of the transistors.

The optimum filter has a response of the form sine ($\omega T/2$)/($\omega T/2$), which can be achieved by cascading the sine filter of FIG. 9, 10, or 11 with an integrating stage which supplies the inverse frequency dependent response of $2/\omega T$. However, the optical receiver of FIG. 6, 7, or 8 already provides such an integrating function, so that the circuits of FIG. 6, 7, or 8 and FIG. 9, 10 or 11, can be directly cascaded to provide the optimum response without having either a differentiator for compensating for the response of the optical receiver or an integrator for complementing the response of the sine filter.

FIG. 12 illustrates in a block diagram an optical receiver arrangement which comprises such cascaded circuits. In FIG. 12, an optical receiver 42, which is as described above with reference to FIG. 6, 7, or 8, has its output coupled directly to a filter 44, which is as described above with reference to FIG. 9, 10, or 11. The output Vout of the filter 44 is coupled via a low-pass filter 46 to a digital comparator 48, from which a recovered binary digital signal is derived in known manner. The low-pass filter 46, which can have a cut-off frequency approximately equal to the bit rate of the digital signal, e.g. 600MHz for a digital signal having a bit rate of 600Mb/s, serves to restrict noise levels to those contributed substantially only within the first lobe of the sine filter of FIG. 9, 10, or 11, as described above. The design of this low-pass filter 46 is not particularly critical, and it can alternatively be between the optical receiver 42 and the filter 44 or incorporated within either of these circuits. The optical receiver arrangement may further include additional amplification and/or a.g.c. stages which may be provided in any desired location between the output of the optical receiver 42 and the input of the comparator 48.

FIG. 13 illustrates an optical receiver in accordance with another embodiment of the invention, which can be used in place of the optical receiver of FIG. 6, 7, or 8, with the sine filter of FIG. 9, 10, or 11 and the optical receiver arrangement of FIG. 12. As illustrated in FIG. 13, this optical receiver is substantially the same as that of FIG. 6 except that the photodiode 10 is biassed in the conventional manner via the load resistor 16 as in the prior art of FIG. 2.

Although embodiments of the invention have been described above in detail, it should be appreciated that numerous modifications, adaptations, and variations may be made thereto without departing from the scope of the invention as defined in the claims.

I claim:

1. A filter for an optical receiver arrangement including an amplifier, the filter comprising a bipolar transistor having a base coupled to the output of said amplifier, a collector from which an output signal is derived, and an emitter; an emitter impedance; and a transmission line having a predetermined length, one end of the transmission line being coupled via the emitter impedance to the emitter and the other end of the transmission line being an open circuit, the emitter impedance being matched to a characteristic impedance of the transmission line.

2. An optical receiver comprising:
an amplifier having an inverting input and an output;
a photodiode coupled between the output and the inverting input of the amplifier;
a semiconductor diode coupled to the photodiode;
means for biasing the photodiode via the semiconductor diode whereby the photodiode is reversed biassed and the semiconductor diode is forward biassed; and
a filter circuit coupled thereto, the filter circuit comprising a bipolar transistor having a base coupled to the output of the transimpedance amplifier, a collector for producing a filtered output signal, and an emitter; an open circuit transmission line having a characteristic impedance and a predetermined length; and an emitter impedance matched to the characteristic impedance coupling the transmission line to the emitter.

3. An optical receiver as claimed in claim 2 and including signal compressing means a.c. coupled between the output of the transimpedance amplifier and a terminal of the semiconductor diode remote from said junction.

4. An optical receiver as claimed in claim 3 wherein the signal compressing means comprises two diodes connected in parallel with one another with opposite polarities.

5. An optical receiver as claimed in claim 2 wherein the transimpedance amplifier comprises an amplifier having an inverting input and an output coupled respectively to the input and the output of the transimpedance amplifier, and a capacitance coupled between the input and the output of the transimpedance amplifier.

6. An optical receiver as claimed in claim 5 wherein the photodiode is coupled between the input and the output of the amplifier, said capacitance comprising a capacitance of the photodiode.

7. An optical receiver as claimed in claim 6 and including a potential divider coupled to the output of the amplifier, wherein the photodiode is coupled to a tapping point of the potential divider and thereby to the output of the amplifier.

8. An optical receiver as claimed in claim 7 wherein the potential divider comprises a capacitive potential divider.

9. An optical receiver as claimed in claim 2 wherein the semiconductor diode is coupled to the photodiode at the inverting input of the amplifier.

10. An optical receiver as claimed in claim 9 wherein the output of the amplifier is a.c. coupled to the photodiode via an attenuator.

11. An optical receiver as claimed in claim 10 wherein the attenuator comprises a resistive potential divider comprising two resistances with a tapping point therebetween connected to the photodiode, one of the resistances being a.c. coupled to the output of the amplifier and the other of the resistances being connected to a supply voltage rail.

12. An optical receiver as claimed in claim 10 wherein the attenuator comprises a capacitive potential divider comprising two capacitances with a tapping point therebetween connected to the photodiode, one of the capacitances being connected to the output of the amplifier and the other of the capacitances being connected to a supply voltage rail, the optical receiver further including means in parallel with said other of the capacitances for conducting a direct current for the photodiode.

13. An optical receiver comprising:
a transimpedance amplifier comprising an amplifier having an inverting input, an output, and a transimpedance element coupled therebetween;
a photodiode and a load impedance therefor connected in series therewith, the load impedance comprising a semiconductor diode poled oppositely to the photodiode;
means for biassing the photodiode via the semiconductor diode whereby the photodiode is reverse biassed and the semiconductor diode is forward biassed;
coupling means coupling a junction between the photodiode and the load impedance to said inverting input; and
filtering means coupled to the output of said amplifier, the filtering means having a gain which increases with increasing frequency wherein the filtering means comprises a bipolar transistor having a base coupled to the output of said amplifier, a collector from which an output signal is derived, and an emitter; an emitter impedance; and a transmission line having a predetermined length, one end of the transmission line being coupled via the emitter impedance to the emitter and the other end of the transmission line being an open circuit, the emitter impedance being matched to a characteristic impedance of the transmission line.

14. An optical receiver as claimed in claim 13 wherein the transimpedance element is constituted by a capacitance of the photodiode.

15. An optical receiver as claimed in claim 13 wherein the load impedance includes an impedance coupled in series with the semiconductor diode on the side thereof remote from the photodiode.

16. An optical receiver as claimed in claim 15 and including signal compressing means a.c. coupled between said output and a junction between the semiconductor diode and said impedance.

17. An optical receiver as claimed in claim 16 wherein the signal compressing means comprises two diodes connected in parallel with one another with opposite polarities.

18. An optical receiver as claimed in claim 13 wherein the transimpedance element comprises a capacitance.

19. An optical receiver arrangement as claimed in claim 18 and including a low-pass filter coupled in series with the filtering means.

20. An optical receiver comprising:
a transimpedance amplifier comprising an amplifier having an inverting input, an output, and a capacitance coupled therebetween, said capacitance constituting a transimpedance element;
a photodiode and a load impedance therefor connected in series therewith;
means for reverse biassing the photodiode via the load impedance;
coupling means coupling a junction between the photodiode and the load impedance to said inverting input; and
filtering means coupled to the output of said amplifier, the filtering means having a gain which increases with increasing frequency; wherein the filtering means comprises a bipolar transistor having a base coupled to the output of said amplifier, a collector from which an output signal is derived, and an emitter; an emitter impedance; and a transmission line having a predetermined length, one end of the transmission line being coupled via the emitter impedance to the emitter and the other end of the transmission line being an open circuit, the emitter impedance being matched to a characteristic impedance of the transmission line.

* * * * *